US008785867B2

(12) United States Patent
Zhang et al.

(10) Patent No.: US 8,785,867 B2
(45) Date of Patent: Jul. 22, 2014

(54) RADIATION DETECTOR, IMAGING DEVICE AND ELECTRODE STRUCTURE THEREOF, AND METHOD FOR ACQUIRING AN IMAGE

(75) Inventors: Lan Zhang, Beijing (CN); Zhiqiang Chen, Beijing (CN); Ziran Zhao, Beijing (CN); Wanlong Wu, Beijing (CN); Yuanjing Li, Beijing (CN); Zhi Deng, Beijing (CN); Xiaocui Zheng, Beijing (CN)

(73) Assignee: Nuctech Company Limited, Beijing (CN)

( * ) Notice: Subject to any disclaimer, the term of this patent is extended or adjusted under 35 U.S.C. 154(b) by 0 days.

(21) Appl. No.: 13/174,174

(22) Filed: Jun. 30, 2011

(65) Prior Publication Data

US 2013/0009068 A1  Jan. 10, 2013

Related U.S. Application Data

(63) Continuation of application No. PCT/CN2011/073669, filed on May 4, 2011.

(30) Foreign Application Priority Data

May 4, 2011  (CN) .......................... 2010 1 0288195

(51) Int. Cl.
*G01T 1/24* (2006.01)
*H01L 27/146* (2006.01)
(52) U.S. Cl.
USPC ................................ 250/370.08; 250/370.14
(58) Field of Classification Search
USPC ....................... 250/370.08, 370.14
See application file for complete search history.

(56) References Cited

U.S. PATENT DOCUMENTS

| 7,256,402 | B1 | 8/2007 | Lee |
| 2004/0080644 | A1* | 4/2004 | Suzuki et al. ................. 348/301 |
| 2006/0081768 | A1* | 4/2006 | Dutta ........................ 250/214.1 |
| 2006/0273352 | A1 | 12/2006 | Rhodes et al. |
| 2009/0207294 | A1 | 8/2009 | Hynecek et al. |

(Continued)

FOREIGN PATENT DOCUMENTS

CN   101546780 A   9/2009

OTHER PUBLICATIONS

PCT/ISA/210 International Search Report for corresponding PCT/CN2011/073669 (dated Aug. 18, 2011).

*Primary Examiner* — David Porta
*Assistant Examiner* — Carolyn Igyarto
(74) *Attorney, Agent, or Firm* — Edwards Wildman Palmer LLP; Scott D. Wofsy; Joshua L. Jones (57) ABSTRACT

The present invention discloses a radiation detector, an imaging device and an electrode structure thereof, and a method for acquiring an image. The radiation detector comprises: a radiation sensitive film, a top electrode on the radiation sensitive film, and an array of pixel units electrically coupled to the radiation sensitive film. Each pixel unit comprises: a pixel electrode (which is configured to collect a charge signal in a pixel area of the radiation sensitive film), a storage capacitor, a reset transistor, a buffer transistor, a column strobe transistor, and a row strobe transistor. The column strobe transistor and the row strobe transistor are connected in series between the buffer transistor and the signal line, and transfer the voltage signal of the corresponding pixel unit in response to a column strobe signal and a row strobe signal. The radiation detector may be used for, for example, X-ray digital imaging.

5 Claims, 6 Drawing Sheets

(56) References Cited

U.S. PATENT DOCUMENTS

| | | | |
|---|---|---|---|
| 2009/0224167 A1* | 9/2009 | Blevis et al. | 250/370.13 |
| 2010/0044677 A1* | 2/2010 | Nagai | 257/21 |
| 2010/0215146 A1* | 8/2010 | Rao et al. | 378/62 |
| 2011/0101420 A1* | 5/2011 | Patel | 257/225 |
| 2011/0263043 A1* | 10/2011 | Livingston | 436/501 |

* cited by examiner

RADIATION DETECTOR, IMAGING DEVICE AND ELECTRODE STRUCTURE THEREOF, AND METHOD FOR ACQUIRING AN IMAGE

CROSS-REFERENCE TO RELATED APPLICATIONS

This application is a continuation of PCT International Application No. PCT/CN2011/073669, which was filed May 4, 2011, which claimed the priority of Chinese Patent Application 201010288195.6, filed Sep. 19, 2010, the entireties of each of which are hereby incorporated by reference.

FIELD OF THE INVENTION

The present invention relates to a radiation detector, an imaging device and an electrode structure thereof, and a method for acquiring an image, and in particular, for example, to an X-ray digital image flat-panel detector and an imaging device.

BACKGROUND OF THE INVENTION

In the past, a radiation-sensitive scintillation layer is employed for converting a ray into a light signal, a television camera is employed for receiving the light signal, and a display screen is employed for displaying the light signal, so that real-time imaging may be realized during radioscopy. With the development of the technologies, the emergence of CCD makes such a real-time imaging mode more optimized. CCD has very superior performances on stability, integrity, consistency and high-speed collection. However, due to the problem of radiation damage resistance of CCD itself, such a real-time imaging mode has an inevitable defect, that is, a radiation sensitive film with a sufficient thickness or a device for the light transmitting path is needed. The commonly used conversion/transmission devices comprise an image enhancer, a lens and an optical fiber, etc., and these conversion/transmission devices are located in front of the CCD in the work flow, thus the factors such as inconsistency, noise and so on that are introduced thereby make various advantages of CCD unable to be shown sufficiently, and at the same time, the complexity of the imaging system is increased and the reliability of the system is lowered.

Since 1990s, technical personnel skilled in the field of radiation imaging has started a study on how to combine advantages such as high speed, high image quality, high integrity, high reliability, large area and operation simplicity, etc., on a radiation imaging detector, thereby developing a digital image flat-panel detector with a large area.

At present, a large area of thousands of square centimeters, a spatial resolution of tens of micrometers and a reading speed of hundreds of frames per second may be realized by a product of digital image flat-panel detector.

A first type of prior art of digital image flat-panel detector employs a combination of an amorphous silicon diode and a TFT. The amorphous silicon diode absorbs a ray and generates electron-hole pairs. Under the influence of an electric field, charged particles with a certain polarity drift to a TFT pixel array, and each pixel signal is read sequentially by the switched scanning with respect to the TFTs.

The ionization energy of amorphous silicon is very low (about 5 eV), accordingly, a great number of electron-hole pairs can be generated under the irradiation of a ray, and a good signal-to-noise ratio can be obtained even in a low dosage.

However, the atomic number of silicon is very small ($Z=14$) and its ability to barrier the ray is rather weak, thus a very thick silicon layer is needed to effectively barrier the ray. This makes the method difficult to be realized technically and makes the cost very high.

A second type of prior art of digital image flat-panel detector employs a combination of an amorphous selenium film and a TFT. The amorphous selenium absorbs a ray and generates electron-hole pairs. Under the influence of an electric field, charged particles with a certain polarity drift to a TFT pixel array, and each pixel signal is read sequentially by the switched scanning with respect to the TFTs.

The atomic number of selenium is 34 and its ability to barrier a ray is stronger than that of the amorphous silicon, but it is only applicable for detecting a ray below 50 KeV. This limits the main application area of an amorphous selenium flat-panel detector to a low energy field (for example, Mammography).

The ionization energy of the amorphous selenium changes as the strength of applied field and the energy of the incident ray vary. In the ranges of the field strength and the ray energy commonly used in medical diagnosis, the ionization energy thereof is about 50 eV, thereby the lowest dosage and the output signal amplitude of the ray are limited.

Moreover, the temperature stability of the amorphous selenium is poor, and it is easy to be deliquesced and crystallized. Thus, its life time is not as good as flat-panel detectors with other structures.

A third type of the prior art of digital image flat-panel detector employs a combination of a scintillator, a photodiode and a TFT. The scintillator converts a ray into a light signal, the photodiode receives the light signal and converts it into an electric signal, and then each pixel signal is read sequentially by the switched scanning with respect to the TFTs.

The scintillator may absorb the ray energy and emit photons of visible light with a wavelength in a certain range, and the number of the photons emitted is in proportion to the energy absorbed. The atomic number of the scintillator material is generally high, and its ability to absorb the ray is strong. The scintillator may be a fluorescent film material (for example, certain rare earth materials) or a scintillating crystal (for example, cesium iodide, cadmium tungstate, etc.).

The atomic number of cesium iodide crystal is larger than either amorphous silicon or amorphous selenium, and it has a good barrier and absorbing ability on rays. Meanwhile, the emission spectrum peak position of thallium-doped cesium iodide crystal is 565 nm, which basically fits the absorption spectrum peak position of the amorphous silicon photodiode, and a combination of the cesium iodide crystal and the amorphous silicon photodiode has the highest quantum efficiency among the products of the same type. Due to these advantages, most of the current digital image flat-panel detectors have a structure in which a cesium iodide crystal, a silicon photodiode and a TFT are combined.

When the scintillator is a homogeneous film material, in order to increase the detectable energy range and the detection efficiency, it is needed to increase the thickness of the film. However, as the film thickness increases, the influence of the scattering of optical photons on the spatial resolution of the detector increases. When the scintillator is a cesium iodide crystal, the scattering of photons may be suppressed by growing the crystal so as to form a high-density acicular array (a needle tube with a size of 10-20 μm).

However, as the thickness of the cesium iodide film increases, the aspect ratio of the needle tube increases, and the collection efficiency of photons inside the tube lowers greatly, so that the quantum efficiency of the detector is decreased. At the same time, due to the problem of size matching between the needle tube and the photodiode, the proportion occupied by the dead zone of such a detector is prone to be large.

Inside the scintillator, the generation of each optical photon requires energy of about 20-50 eV; moreover, in consideration of the quantum efficiency of the photodiode on the visible light wave band, a detector with such a structure requires the energy of about 100 eV or even more to generate each electron-hole pair. Such a performance determines that a relatively poor signal-to-noise ratio will be obtained when a scintillator is employed as a radiation sensitive film.

A fourth type of prior art of digital image flat-panel detector employs a combination of a scintillator and a CMOS. The scintillator may be directly overlaid on the CMOS, or an optical fiber with different diameters on its two ends may be employed to combine a scintillator having a large area with a CMOS having a small area.

By substituting a CMOS process for the traditional silicon process, the system integrity may be increased to a greater extent, and the spatial resolution, duty ratio, collection speed and so on of the detector may be increased greatly. Each pixel unit is integrated with an independent charge-voltage converting circuit and an independent amplifying circuit, thus a better signal-to-noise ratio can be obtained.

However, as limited by the CMOS process, it is difficult for such a flat-panel detector to obtain a large sensitive area under a low cost. But, it has evident advantages in the small area detection field, for example, dentistry CT and CT for small animals, etc.

In conclusion, in the prior art digital image flat-panel detectors, when factors such as dynamic range (detectable energy range), detection efficiency, signal-to-noise ratio and spatial resolution, etc., are considered, the main ray conversion mode is as follows: a ray is first converted into an photon of visible light by using a high-density acicular cesium iodide scintillator, and then the photon of visible light is converted into an electric signal via a photodiode.

TFT reading or CMOS reading is mainly employed for the reading of an electric signal. One of the TFT and CMOS is selected according to the actually required factors such as the area, spatial resolution, collection speed, integrity, cost and so on.

SUMMARY OF THE INVENTION

The present invention provides a digital image flat-panel detector and an imaging device with a simple structure and a high quantum efficiency, wherein no scintillator or optical-electrical converting apparatus is needed.

According to one aspect of the invention, there is provided a radiation detector, which comprises: a radiation sensitive film, a top electrode on the radiation sensitive film, and an array of pixel units electrically coupled to the radiation sensitive film, wherein each pixel unit comprises: a pixel electrode, which is configured to collect a charge signal in a pixel area of the radiation sensitive film; a storage capacitor, which is connected to the pixel electrode, and is configured to store the charge signal collected by the pixel electrode; a reset transistor, which is connected to the pixel electrode, and is configured to clear the charge in the storage capacitor; a buffer transistor, which is connected to the pixel electrode, and is configured to convert the charge signal on the pixel electrode into a voltage signal and transfer the voltage signal to a signal line; a column strobe transistor, which is configured to select a predetermined column of the pixel electrodes; and a row strobe transistor, which is configured to select a predetermined row of the pixel electrodes, wherein, the column strobe transistor and the row strobe transistor are connected in series between the buffer transistor and the signal line, and transfer the voltage signal of the corresponding pixel unit in response to a column strobe signal and a row strobe signal.

According to a further aspect of the invention, there provides a digital imaging device, comprising: a radiation source, which is configured to generate radiation; a radiation detector as described above, which is configured to detect a dosage of the radiation that passes through an object to be detected; a data acquisition system, which is configured to convert an analog signal outputted from the radiation detector into a digital signal; and an image processor, which is configured to process the digital signal into an image.

According to a further aspect of the invention, there provides an electrode structure for a radiation detector, comprising: a pixel electrode; and a grid-like steering electrode, which surrounds at least one pixel electrode, and the pixel electrode and the steering electrode are electrically isolated from each other.

According to a further aspect of the invention, there provides a method for acquiring an image by using the above-mentioned radiation detector, comprising the steps of:

a) applying a reset signal to each column of pixel units to reset all pixel units;

b) turning off reset transistors, column strobe transistors and row strobe transistors of all the pixel units, collecting charge signals by pixel electrodes, and accumulating the charge signals on storage capacitors;

c) applying a column strobe signal to a first column of pixel units after a predetermined integrating time is reached, and then applying row strobe signals sequentially to the corresponding pixel units in the column, thereby turning on the column strobe transistor and the row strobe transistor of the corresponding pixel unit, so that the electric potentials of the pixel electrodes in the first column of pixel units are read one by one as sensing signals;

d) turning off the column strobe transistor and the row strobe transistors of the first column of pixel units, and applying a reset signal to the first column, thereby turning on the reset transistors of the first column of pixel units, that is, resetting the first column of pixel units;

e) turning off the reset transistors of the first column of pixel units, applying a column strobe signal to the first column of pixel units, and then applying row strobe signals sequentially to the corresponding pixel units in the column, thereby turning on the column strobe transistor and the row strobe transistors of the corresponding pixel unit, so that the electric potentials of the pixel electrodes of the first column of pixel units are read one by one as background signals;

f) repeating steps c) to e), and for other columns, reading the charge signals collected on the pixel electrodes on a pixel-by-pixel basis; and g) obtaining a frame of image by data processing after all the pixels are read.

On one hand, for the detector and the imaging device thereof put forward by the invention, under the premise that detection efficiency, detection energy range, signal-to-noise ratio and spatial resolution are guaranteed, a radiation sensitive film (for example, mercuric iodide film) is utilized to directly convert a ray into an electric signal, thereby the step of converting a ray into photons of visible light and then converting the photons of visible light into an electric signal is omitted, the structure of the detector is simplified, the loss of effective signals in the intermediate process is reduced, and the quantum efficiency of the detector is increased. Moreover, problem such as afterglow of scintillator is no longer exist, so that the detector will be more sensitive to the variation of irradiation dosage, and the scanning speed may be further increased.

On the other hand, by using a pixel unit containing four transistors (4T), the collecting, outputting and data processing of an electric signal may be realized, and it may be realized as a TFT pixel array, CMOS pixel array, circuit board and signal processing IC. This increases the integrity of the system, and makes it more superior in performance specification and more applicable for practical application area.

Because the 4T pixel unit outputs a voltage signal directly, the interference of an external circuit on an analog signal may be reduced, and the signal-to-noise ratio of the system may be increased. At the same time, the complexity of the subsequent ASIC design may be reduced, and the reliability of the device may be increased.

By using a CMOS pixel array or a TFT pixel array containing 4T pixel units, the integrity of the system may be increased, so that the requirement of a high spatial resolution in a small area may be met.

A pixel array may be formed by using a signal processing IC containing a 4T pixel unit together with a circuit board, thus pixel electrodes in a certain area may be led to a signal processing IC for collecting electric signals and performing processing thereto. Therefore, the design scale of the signal processing IC may be reduced, and the cost may be lowered to the maximum extent.

A grid-like steering electrode with a certain structure may be provided between pixels or between pixel areas as well as in the periphery of the pixel array, thus the surface leakage current of the detector may be collected, and the noise of the detector may be lowered. At the same time, the electric potential of the steering electrode is made slightly different from the electric potentials of the pixel electrodes (when electrons are collected, the electric potential of the steering electrode is slightly lower than that of the pixel electrodes; when holes are collected, the electric potential of the steering electrode is slightly higher than that of the pixel electrodes), and a weak electric field exists between the steering electrode and the pixel electrodes, thus charge accumulation may be effectively prevented, the charge collection rate may be increased, the dead zone of the detector may be reduced, and the polarization effect of the detector may be alleviated. Therefore, the performance of the detector may be further optimized.

DETAILED DESCRIPTION OF THE EMBODIMENTS

The invention will now be described in more detail by referring to the drawings, in which embodiments of the invention are shown. However, the invention may be specifically realized by employing various different forms, rather than being limited to the embodiments provided herein.

Figure 1A:
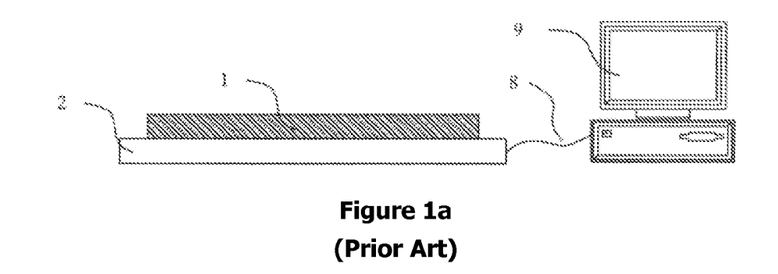
FIG. 1a to FIG. 1c respectively show the schematic structures of three types of digital image flat-panel detectors according to the prior art.
Figure 1B:
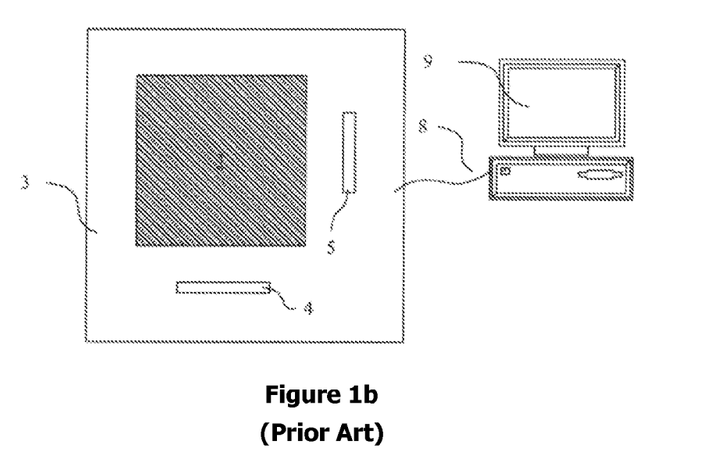
Figure 1C:
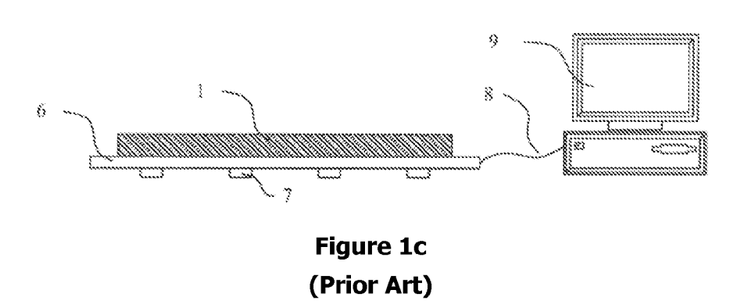

FIG. 1a to FIG. 1c respectively show three types of digital image flat-panel detectors according to the prior art. Mercuric iodide ($HgI_2$) film 1 is a continuous film, or it is patterned to discrete pixel areas corresponding to the pixel electrodes, and the CMOS pixel array 2, TFT pixel array 3 and electrode array of printed circuit board (PCB) 6 are respectively used to provide pixel units of a digital image. The pixel signals obtained by the detector are transferred to an image processor 9 (for example, a computer) via a cable 8 to form a digital image and the digital image is displayed on a display.

As shown in FIG. 1a, the mercuric iodide film 1 is located above the CMOS pixel array 2, for example, it is formed on top of the CMOS pixel array 2 directly via evaporation coating, as a part of the integrated circuit. Access to each pixel area in the mercuric iodide film 1 is realized via the CMOS pixel array 2.

As shown in FIG. 1b, the mercuric iodide film 1 is located above a TFT pixel array 3, for example, it is formed on top of the TFT pixel array 3 directly via evaporation coating, as a part of the integrated circuit. Access to each pixel area in the mercuric iodide film 1 is realized via electrodes 4 and 5.

As shown in FIG. 1c, the mercuric iodide film 1 is located on one side of a circuit board 6, a signal processing IC 7 is provided on the other side of the circuit board, and the mercuric iodide film 1 and the signal processing IC 7 are connected via wirings and through holes on the circuit board. Moreover, the signal processing IC 7 is connected to an image processor 9. Access to each pixel area in the mercuric iodide film 1 is realized via an electrode array (not shown) formed on the circuit board.

Because mercuric iodide is a semiconductor material, its ionization energy is on the same order of magnitude (<10 eV) as that of amorphous silicon, and the ray energy it needs to obtain electron-hole pairs is far less than that of cesium iodide or amorphous selenium. Under the ray irradiation of the same energy/dosage, the number of electron-hole pairs generated is far greater than that of cesium iodide or amorphous selenium. The forbidden bandwidth of mercuric iodide is about twice of that of silicon; at the same time, the electrical resistivity may reach $10^{14}$ Ω·cm, thus its leakage current at room temperature is very small, and its noise performance is far more superior to a silicon photodiode. Therefore, a better signal-to-noise ratio may be obtained by employing mercuric iodide as the radiation sensitive film, and a ray with a lower energy can be measured (lower limit of a dynamic range).

It is recognized by the inventor that, under the same irradiation dosage, a more excellent image quality may be obtained by employing mercuric iodide as the radiation sensitive film.

A mercuric iodide film may be overlaid on the pixel array by a method such as vacuum physical vapor deposition, sputtering, spray coating, hot pressing and screen printing, etc.

However, according to the practical application area (for example, ray energy, detection efficiency and process requirement, etc.), other semiconductor materials, for example, lead iodide (PbI$_2$), cadmium zinc telluride (CdZnTe), cadmium telluride (CdTe), gallium arsenide (GaAs), thallium bromide (TlBr), indium phosphide (InP), cadmium selenide (CdSe), cadmium sulphide (CdS), indium arsenide (InAs), lead sulphide (PbS), indium antimonide (InSb), lead telluride (PbTe) and mercury selenide (HgSe), etc., may be used to replace mercuric iodide.

Moreover, just as known in the prior art, one of TFT and CMOS is selected according to factors such as the area, spatial resolution, collection speed, integrity, cost and so on needed practically. For example, in the small area imaging field (dentistry), CMOS is preferred.

In addition, in the case that less requirement is laid on spatial resolution, a circuit board (PCB) may even be used to replace the TFT array.

Figure 2A:
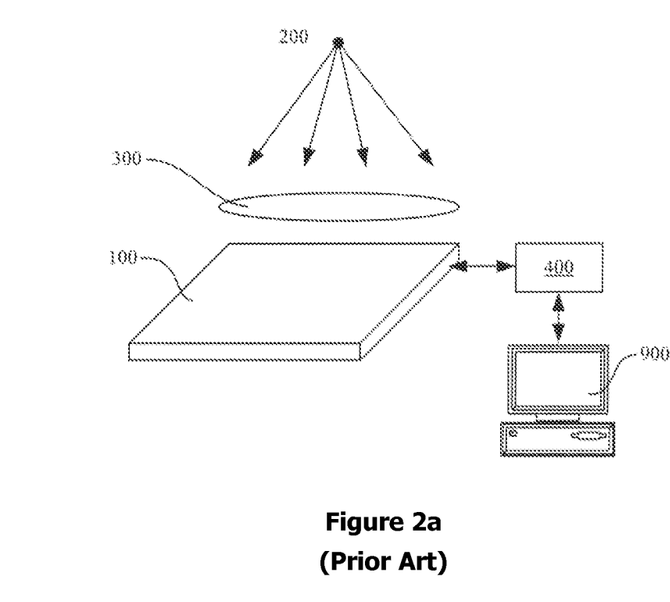
FIG. 2a to FIG. 2b respectively show the schematic structures of two types of digital imaging devices according to the prior art.

FIG. 2a shows a schematic structure of a digital imaging device for plane imaging according to the prior art. Radiation from a radiation source 200 passes through an object 300 to be detected, and then reaches a detector 100. The detector 100 comprises a two-dimensional pixel array, which may be an integral two-dimensional pixel array or may be jointed by a plurality of one-dimensional or two-dimensional pixel arrays. Each pixel signal is related to the radiation dosage of the pixel area, and is then converted into a digital signal by a subsequent data acquisition system (DAQ) 400 and transferred to an image processor 900.

Figure 2B:
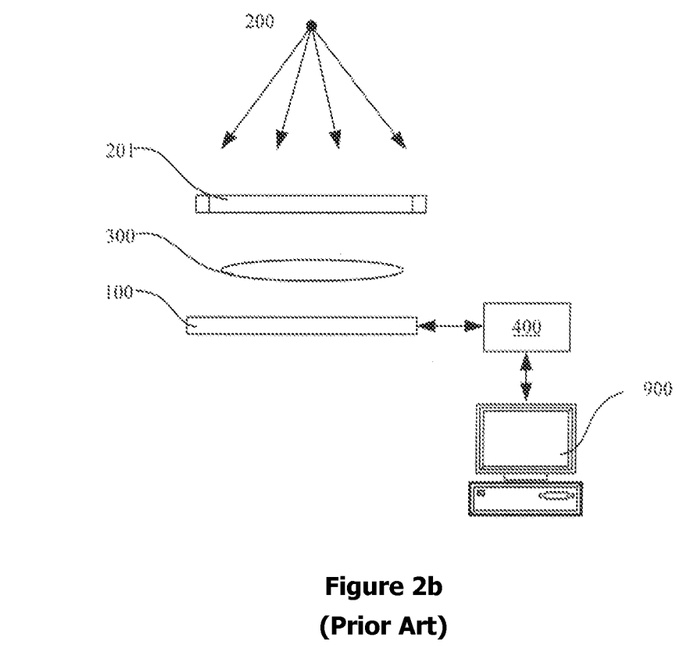

FIG. 2b FIG. 2b shows a digital imaging device for imaging by linear scanning. The radiation from a spot radiation source 200 is shaped into a linear radiation fan beam via a collimator 201, then it passes through the object 300 to be detected and reaches the detector 100, and then it is converted into a digital signal by the subsequent data acquisition system (DAQ) 400 and transferred to the image processor 900.

As different from the digital imaging device shown in FIG. 2a, in the digital imaging shown in FIG. 2b, linear scanning is performed on the object 300 to be detected via the relative movement of the object 300 to be detected with respect to the radiation source 200, the collimator 201 and the detector 100, so as to form a two-dimensional digital image extended in the scanning direction.

For example, the radiation source 200, the collimator 201 and the detector 100 move in the scanning direction synchronously, while the object 300 to be detected is fixed. Alternatively, the radiation source 200, the collimator 201 and the detector 100 are all fixed, while only the object 300 to be detected moves in the scanning direction.

As a result, the digital imaging device may perform plane imaging with respect to the object 300 to be detected having a large size by using a detector 100 having a small size, so that the manufacturing cost of the digital imaging device may be reduced.

Figure 3A:
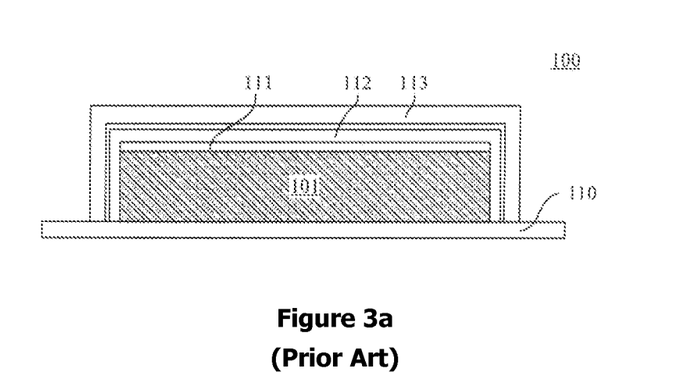
FIG. 3a to FIG. 3b show more detailed structures of digital image flat-panel detectors according to the prior art.

Referring to FIG. 3a, the detector 100 comprises: a pixel array 110; a mercuric iodide film 101 located above the pixel array 110; a top electrode 111 located on the mercuric iodide film 101; a protection layer 112 enveloping the mercuric iodide film 101 and the top electrode 111; and a cover 113 enveloping the protection layer. The pixel array 110 may be a TFT array, a CMOS array or a circuit board.

The top electrode 111 may comprise metal palladium (Pd), tin indium oxide (ITO), carbon membrane, indium oxide (In$_2$O$_3$), tin oxide (SnO$_2$), tungsten titanium (TiW), or other appropriate conductive material that does not react with mercuric iodide. The protection layer 112 is made of stable moisture-proof antistatic insulating material, which does not chemically react with mercuric iodide, such as silicon rubber, resin material, or other thermoplastic material (for example, parylene). The cover 113 is made of insulating, light-blocking and antistatic material.

The radiation may pass through the cover 113, the protection layer 112 and the top electrode 111 and reach the mercuric iodide film 101. The interaction between the radiation and the mercuric iodide film generates electron-hole pairs, and the electron-hole pairs drift to the pixel array 110 and the top electrode 111 respectively under the action of an electric field, then are collected by the electrode directly, and a processing is performed thereon by a signal processing circuit.

Figure 3B:
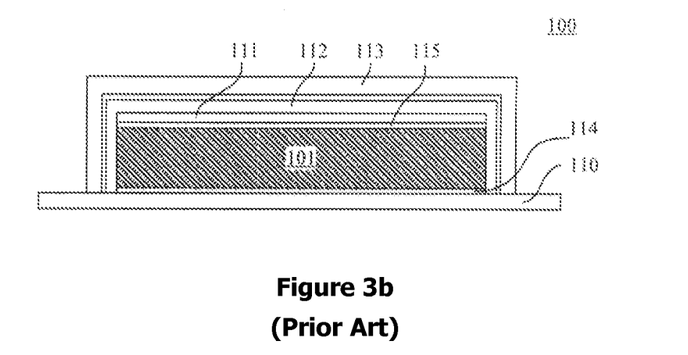

In a variation of the detector 100 shown in FIG. 3b, it further comprises a first intermediate protection layer 114 located between the mercuric iodide film 101 and the pixel array 110, and a second intermediate protection layer 115 located between the mercuric iodide film 101 and the top electrode 111, in order to realize the long-term stability of the detector. The first intermediate protection layer 114 and the second intermediate protection layer 115 are formed of dielectric, which may be the same as or different from the material of the aforementioned protection layer 112.

For the detector 100 shown in FIG. 3a and FIG. 3b, it is preferred to neutralize the residual charges in the mercuric iodide film 101 by periodically (for example, between each frame or every several frames of the signal) applying a reverse electric field to the pixel area, so that the detector 100 may work stably for a long term.

Figure 4:
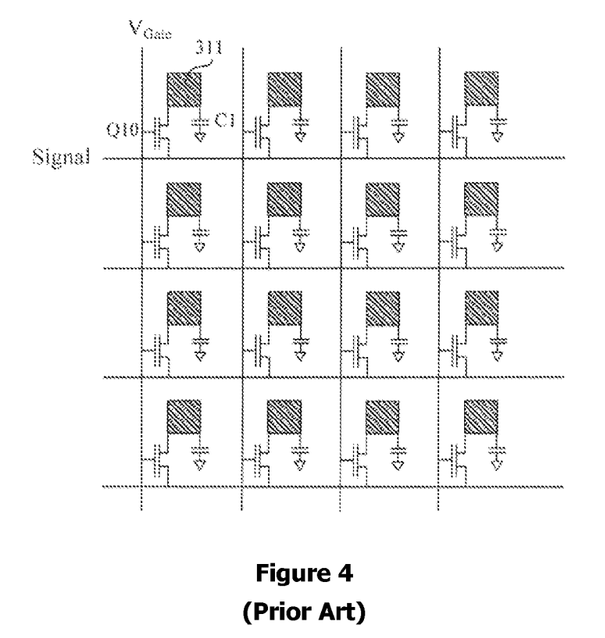
FIG. 4 shows a TFT pixel array of a digital image flat-panel detector according to the prior art.

FIG. 4 shows a TFT pixel array of a sensor part in a digital image flat-panel detector according to the prior art. Each pixel unit consists of a pixel electrode 311, a transistor Q10 and a storage capacitor C1. The drain electrode of the transistor Q10 is connected to a pixel electrode 311, and the pixel electrode 311 is grounded via the storage capacitor C1.

The pixel electrode 311 is electrically connected to a pixel area of the mercuric iodide film to collect a charge signal. As described above, the ray energy deposits in the mercuric iodide film which is used as a radiation sensitive film, when radiation is applied on the mercuric iodide film, and a charge signal is generated and then collected by the pixel electrode 311.

The storage capacitor C1 is adapted to store charges. When the transistor Q10 is turned off, the charges collected by the pixel electrode 311 are stored in the storage capacitor C1. When the transistor Q10 is turned on, the charge signal Signal in the storage capacitor C1 may be read.

The gate electrode of transistor Q1 is connected to an external control signal $V_{Gate}$, while the source electrode is connected to a reading circuit (for example, an integrating amplifier circuit). The control signal $V_{Gate}$ may be provided by a programmable logic chip, and the related logic control may be realized in the following mode:

a) when the transistor Q10 is turned off, the pixel electrode 311 collects the charge signal and accumulates the charge signal on the storage capacitor C1;

b) after predetermined integrating time is reached, a strobe signal $V_{Gate}$ is applied to the first column of pixel units, the first column of transistors Q10 are turned on, and the storage capacitor C1 of each unit in the first column is discharged, so that the charge signal is read;

c) Step b) is repeated, and for other columns, the charge signals collected on the pixel electrodes are read on a column-by-column basis;

d) after all the columns are read, a frame of image may be obtained by data processing.

Because the integrating time of each column in the first frame of image is generally inconsistent, the data of the first frame of image is discarded, and each subsequent frame of image becomes effective data.

Figure 5:
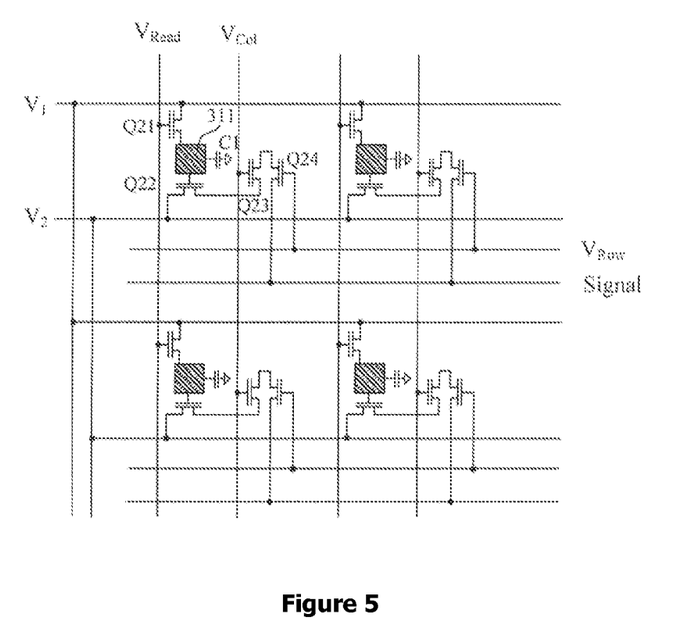
FIG. 5 shows a pixel array of a digital image flat-panel detector according to the invention.

FIG. 5 shows a pixel array of the sensor part in the digital image flat-panel detector according to the invention. Each pixel unit comprises: a pixel electrode 311, four transistors (Q21, Q22, Q23, Q24) and a storage capacitor C1.

The pixel electrode 311 is electrically coupled to a pixel area of the mercuric iodide film to collect the charge signal. As described above, the ray energy deposits in the mercuric iodide film which is used as a radiation sensitive film, when radiation is applied on the mercuric iodide film, and a charge signal is generated and then collected by the pixel electrode 311.

The storage capacitor C1 is used for storing the charges. When charges are accumulated on the storage capacitor C1, the electric potential of the pixel electrode 311 may vary. The variance of the electric potential is in proportion to the amount of charges accumulated, that is, in proportion to the ray energy deposited in the pixel area.

The transistor Q21 is used for resetting, and its gate electrode is connected to a reset control signal ($V_{Reset}$). When the transistor Q21 is turned on, the charges accumulated on the storage capacitor C1 is cleared, the pixel electrode 311 is restored to a fixed initial level $V_1$, and the detector is restored to the initial state.

The transistor Q22 is used for buffering so as to drive a subsequent circuit, and its gate electrode is connected to the pixel electrode 311. A fixed bias level $V_2$ is applied to the drain electrode to make the transistor Q22 work in a follow state. Because the state of Q22 is not changed during the operation procedure, a fixed level $V_2$ is applied to the drain electrode of the transistor Q22 all the time.

The transistor Q23 is used for column strobe, and its gate electrode is connected to a column strobe signal ($V_{Col}$) to control the sequence of reading as well as the integrating time and reading time of each column; the transistor Q24 is used for row strobe, and its gate electrode is connected to a row strobe signal ($V_{Row}$) to select a row to be outputted.

The transistors Q23 and Q24 are connected in series. If transistors Q23 and Q24 are selected simultaneously, the charge signal stored in the storage capacitor will pass through the pixel electrode 311, the buffer transistor Q21, the column strobe transistor Q23 and the row strobe transistor Q24 sequentially and be transferred onto the signal line Signal, so that the electric potential of the pixel electrode 311 of the corresponding pixel unit may be read.

The gate electrodes of the transistors Q21 on the same column of pixel units are connected to a same reset signal ($V_{Reset}$); the gate electrodes of the transistors Q23 of the same column of pixel units are connected to a same column strobe signal ($V_{Col}$); the gate electrodes of the transistors Q24 of the same row of pixel units are connected to a same row strobe signal ($V_{Row}$); and the source electrodes of the transistors Q24 of the same row of pixel units are connected to a same subsequent circuit (for example, a multiplexing switch, a level converter or an ADC).

By measuring the variance of electric potential of the pixel electrode 311 before reset (sensing signal) and after reset (background signal), the ray energy deposits in the pixel area may be calculated, so that the image information of the pixel may be obtained.

In this reading method, a voltage value is outputted. In comparison with the traditional transistor reading mode, the anti-interference capability is stronger, and the data processing circuit is simpler at the same time.

The related logic control is implemented in the following mode:

a) a reset signal $V_{Reset}$ is applied to each column of pixel units to reset all the pixel units;

b) the transistors Q21, Q23 and Q24 of all the pixel units are turned off, and the pixel electrode 311 collects charge signals and accumulates the charge signals on the storage capacitor C1;

c) after a predetermined integrating time is reached, a column strobe signal $V_{Col}$ is applied to the first column of pixel units, and then row strobe signals $V_{Row}$ is applied to the corresponding pixel units in the column sequentially so as to turn on the transistors Q23 and Q24 of the corresponding pixel units, so that the electric potentials of the pixel electrodes 311 in the first column of pixel units are read one by one as sensing signals;

d) the transistors Q23 and Q24 of the first column of pixel units are turned off, and a reset signal $V_{Reset}$ is applied to the first column, so that the transistors Q21 of the $V_{Reset}$ is first column of pixel units are turned on, that is, the first column of pixel units are reset;

e) the transistors Q21 of the first column of pixel units are turned off, and a column strobe signal $V_{Col}$ is applied to the first column of pixel units, and then row strobe signals $V_{Row}$ is applied to the corresponding pixel units in the column sequentially so as to turn on the transistors Q23, Q24 of the corresponding pixel units, so that the electric potentials of the pixel electrodes 311 of the first column of pixel units are read one by one as background signals;

f) Steps c) to e) are repeated, and for other columns, the charge signals collected on the pixel electrodes are read on a pixel-by-pixel basis; and g) after all the pixels are read, a frame of image may be obtained via a certain data processing (for example, subtracting the background signal from the sensing signal).

Usually, because the integrating time of each column in the first frame of image is generally inconsistent, the data of the first frame of image is discarded, and each subsequent frame of image becomes effective data.

During the steps a) to g), a constant bias voltage may be applied to the top electrode of the radiation sensitive film, so that a collecting electric field with a sufficient intensity is formed in the sensitive region of the radiation detector. When the charge signal generated in the pixel area is generated by the electrons, the bias voltage is a negative bias voltage. When the charge signal generated in the pixel area is generated by the holes, the bias voltage is a positive bias voltage.

According to the polarization degree and the amount of residual charges of the detector, periodically changing the polarity of the bias voltage (reverse bias voltage) on the top electrode is further comprised between each frame of image or every several frames of images, and electric fields with opposite directions are formed in the sensitive region of the detector, so as to eliminate the polarization phenomenon of the detector during the operation procedure and neutralize the residual charges.

The pixel unit of the digital image flat-panel detector according to the invention has a 4T structure (that is, it comprises four transistors). Compare with the prior art digital image flat-panel detector shown in FIG. 4 (wherein, the pixel unit has a 1T structure), the digital image flat-panel detector of the invention may read signals not only on a column-by-column basis, but also on a pixel-by-pixel basis.

Moreover, when the object to be detected has a very small area, signals may be only read selectively on the corresponding pixel area of the object to be detected so as to reduce the effective imaging area of the detector, so that data redundancy may be reduced and data processing speed may be increased.

When a dead spot appears on the detector, it may be masked by the row strobe and column strobe functions. Especially, in some cases, a dead spot may output a high voltage, and a great influence may be laid on the subsequent circuits. By turning off the dead spot from the subsequent circuits via the row strobe function, neither subsequent circuit nor any peripheral pixel is influenced.

The pixel array shown in FIG. 5 may be implemented as any one of the CMOS pixel array 2 shown in FIG. 1a, the TFT pixel array 3 shown in FIG. 1b, and a combination of the circuit board 6 and the signal processing IC 7 shown in FIG. 1c. Furthermore, the detector thus formed may be used for any one of the digital imaging device for plane imaging shown in FIG. 2a and the digital imaging device for linear scanning shown in FIG. 2b.

Figure 6:
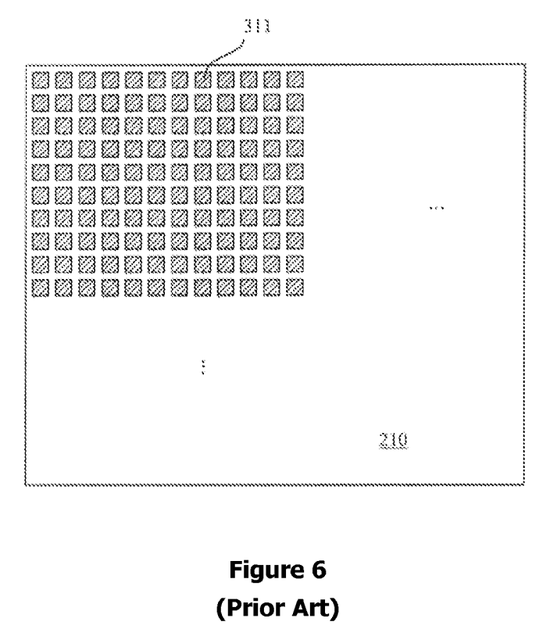
FIG. 6 shows a top view of a pixel electrode in a digital image flat-panel detector according to the prior art.

FIG. 6 shows a top view of a pixel electrode in a digital image flat-panel detector according to the prior art. For example, an array of pixel electrodes 311 is formed on a circuit board 210. Each pixel electrode 311 acts as a part of the pixel unit shown in FIG. 5, and is electrically coupled to a pixel area of the mercuric iodide film. The pixel electrodes 311 are electrically isolated from each other.

Figure 7:
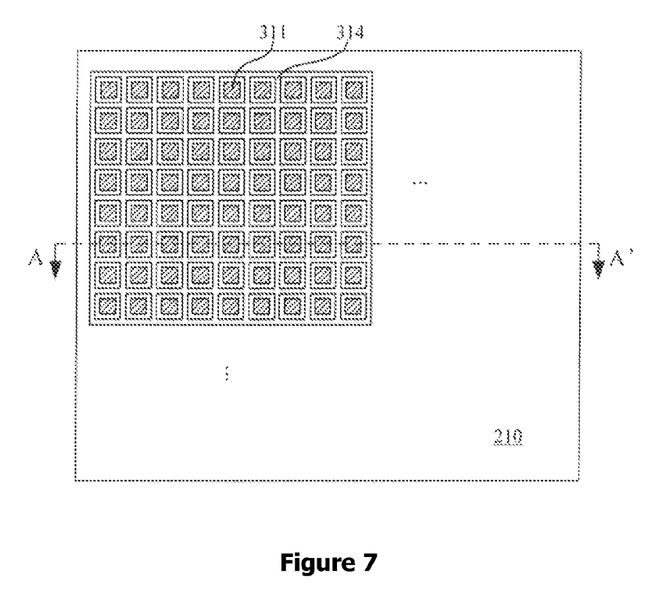
FIG. 7 shows a top view of a pixel electrode in a digital image flat-panel detector according to the invention.

FIG. 7 shows a top view of a pixel electrode in a digital image flat-panel detector according to the invention. As different from the pixel electrode shown in FIG. 6, the electrode structure shown in FIG. 7 comprises pixel electrodes 311 and a grid-like steering electrode 314 surrounding each pixel electrode 311. The pixel electrodes 311 are electrically isolated from each other, and the pixel electrodes 311 and the steering electrode 314 are electrically isolated.

Figure 8A:
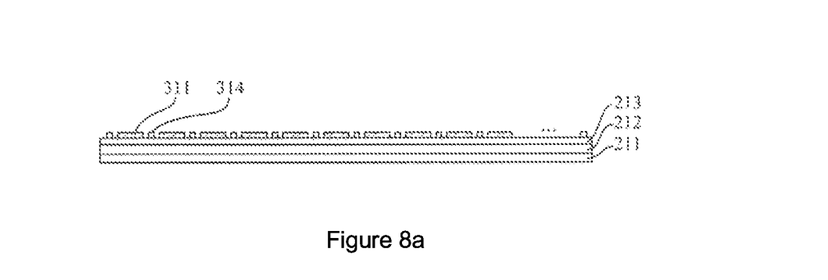
FIG. 8a and FIG. 8b respectively show sectional views of pixel electrodes in digital image flat-panel detectors according to the invention.

FIG. 8a shows a sectional view of pixel electrodes in a digital image flat-panel detector according to the invention. A transistor of each pixel unit in the CMOS pixel array or the TFT pixel array is formed in an active layer 212 above a substrate 211. An interlayer insulating layer 213 is located between the pixel electrode 311, the steering electrode 314 and the active layer 212. The pixel electrode 311 and the steering electrode 314 are electrically connected to an transistor in the active layer 212 by vias (not shown) in the interlayer insulating layer 213.

The pixel electrodes 311 and the steering electrode 314 may be formed of the same or different metallic layers. Usually, both of them are located on the same plane and are formed of the same metallic layer.

Figure 8B:
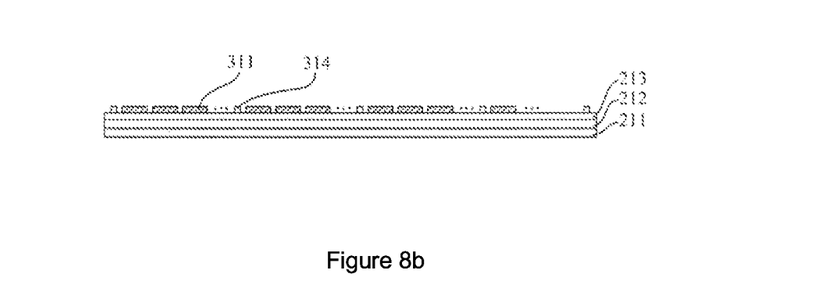

FIG. 8b shows a variation of the above pixel electrodes, wherein each grid of the grid-like steering electrode 314 contains at least two pixel electrodes 311.

Figure 9A:
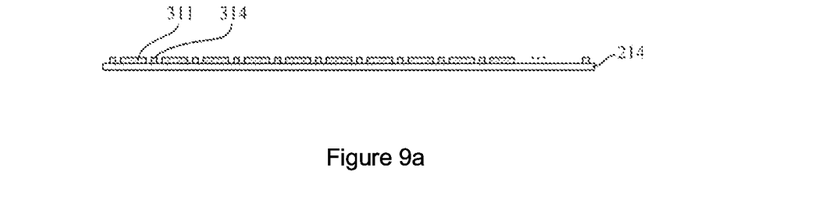
FIG. 9a and FIG. 9b respectively show sectional views of pixel electrodes in digital image flat-panel detectors according to the invention.

FIG. 9a shows a sectional view of pixel electrodes in the digital image flat-panel detector according to the invention. Pixel electrodes 311 and a steering electrode 314 are formed on one side of a circuit board 214, a signal processing IC (not shown) is provided on the other side of the circuit board, and the pixel electrodes 311 and the steering electrode 314 are connected to the signal processing IC via wirings and through holes on the circuit board.

The signal processing IC comprises transistors Q21-Q24 and storage capacitors C1 in the pixel units.

The pixel electrodes 311 and the steering electrode 314 may be formed of the same or different metallic layers. Usually, both of them are located on the same plane and are formed of the same metallic layer.

Figure 9B:
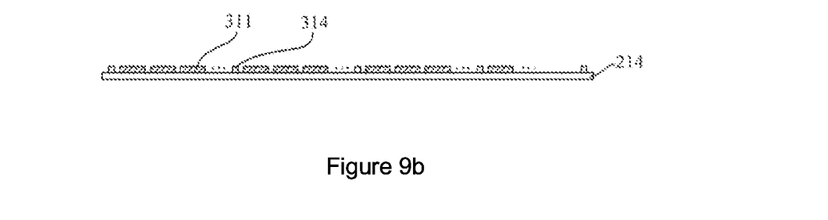

FIG. 9b shows a variation of the above pixel electrodes, wherein each grid of the grid-like steering electrode 314 contains at least two pixel electrodes 311.

It should be noted that the shape of the pixel electrodes 311 is not limited to rectangle, and it may also be a shape of circle, diamond, hexagon, or the like.

The electrode structures shown in FIG. 7 to FIG. 9 may be implemented as the pixel electrodes in any one of the CMOS pixel array 2 shown in FIG. 1a, the TFT pixel array 3 shown in FIG. 1b and the circuit board shown in FIG. 1c. Furthermore, the detector thus formed may be used in any one of the digital imaging device for plane imaging shown in FIG. 2a and the digital imaging device for linear scanning shown in FIG. 2b.

It has been known that a serious surface leakage current exists on a flat-panel detector with a large area. In the detector of the invention, a grid-like steering electrode 314 surrounding each pixel electrode 311 is employed, thus the surface leakage current on the detector may be effectively collected, the influence of the leakage current on the pixel electrode 311 may be reduced, and the noise of the detector may be lowered.

Preferably, the electric potential of the steering electrode 314 is slightly different from the electric potential of each pixel electrode 311 (when electrons are collected, the electric potential of the steering electrode 314 is slightly lower than that of each pixel electrode 311; and when holes are collected, the electric potential of the steering electrode 314 is slightly higher than that of each pixel electrode 311), so that a weak electric field exists between the steering electrode 314 and the pixel electrodes 311. The steering electrode 314 can effectively prevent the accumulation of charges on the blank zone between pixels where no electrode exists, and further prevent the electric field generated by the accumulated charges from weakening the intensity of the charge collecting electric field that is applied, reduce the dead zone of the detector, and alleviate the polarization effect of the detector.

More preferably, the bias potential applied to the steering electrode 314 provides a shaping electric field to each pixel area and further increases the collection efficiency of charges. By changing the shapes of the pixel electrodes and the steering electrode, a shaping electric field with an ideal shape may be obtained. For example, the shape of the pixel electrodes may be any one selected from circle, ellipse and polygon. Preferably, the shape of the pixel electrodes is a square. The grid shape of the grid-like steering electrode is substantially the same as the shape of the pixel electrodes.

Several embodiments of the invention have been described above. Those skilled in the art may understand that various variations, alternations and equivalents thereof may be made without departing from the spirit or scope of the invention. Therefore, the above descriptions should not be interpreted as limiting the scope of the invention.

What is claimed is:

1. A method for acquiring an image by using a radiation detector comprising the steps of:
    a) applying a reset signal to each column of an array of pixel units to reset all pixel units;
    b) turning off reset transistors, column strobe transistors and row strobe transistors of all the pixel units, collecting charge signals by pixel electrodes, and accumulating the charge signals on storage capacitors;
    c) applying a column strobe signal to a first column of pixel units after a predetermined integrating time is reached, and then applying row strobe signals to corresponding pixel units in the first column sequentially, thereby turning on the column strobe transistor and the row strobe transistor of a corresponding pixel unit, so that electric potentials of pixel electrodes in the first column of pixel units are read one by one as sensing signals;
    d) turning off the column strobe transistor and the row strobe transistors of the first column of pixel units, and applying a reset signal to the first column, thereby turning on the reset transistors of the first column of pixel units, that is, resetting the first column of pixel units;

e) turning off the reset transistors of the first column of pixel units, applying a column strobe signal to the first column of pixel units, and then applying row strobe signals to the corresponding pixel units in the column sequentially, thereby turning on the column strobe transistor and the row strobe transistor of the corresponding pixel unit, so that the electric potentials of the pixel electrodes of the first column of pixel units are read one by one as background signals;

f) repeating steps c) to e), and for other columns, reading the charge signals collected on the pixel electrodes on a pixel-by-pixel basis;

g) obtaining a frame of image by data processing after reading all the pixels, wherein, steps c) to g) are repeated to acquire multiple consecutive frames of images; and h) applying a constant second bias voltage to a top electrode of a radiation sensitive film between each frame of image or several frames of images, so as to eliminate polarization phenomenon of the detector during an operation procedure, wherein a polarity of the second bias voltage is opposite to a polarity of a first bias voltage is applied to the top electrode of the radiation sensitive film.

2. The method according to claim 1, wherein, the step g) further comprises subtracting the background signals from the sensing signals.

3. The method according to claim 1, wherein, during step a) to step g), the first bias voltage is applied to the top electrode of the radiation sensitive film, so that a collecting electric field with a sufficient intensity is formed in a sensitive region of the radiation detector.

4. The method according to claim 3, wherein, the first bias voltage is a negative bias voltage.

5. The method according to claim 3, wherein, the first bias voltage is a positive bias voltage.

* * * * *

UNITED STATES PATENT AND TRADEMARK OFFICE
CERTIFICATE OF CORRECTION

| | | |
|---|---|---|
| PATENT NO. | : 8,785,867 B2 | Page 1 of 1 |
| APPLICATION NO. | : 13/174174 | |
| DATED | : July 22, 2014 | |
| INVENTOR(S) | : Lan Zhang et al. | |

It is certified that error appears in the above-identified patent and that said Letters Patent is hereby corrected as shown below:

Title Page, should read:

(30)   Foreign Application Priority Data

September 19, 2010 (CN)...........................2010 1 0288195

Signed and Sealed this
Seventeenth Day of March, 2015

Michelle K. Lee
*Director of the United States Patent and Trademark Office*